United States Patent [19]

Rommel et al.

[11] Patent Number: 5,317,264

[45] Date of Patent: May 31, 1994

[54] METHOD FOR PERFORMING MAGNETIC RESONANCE SPECTROSCOPY OR TOMOGRAPHY IN A PRESELECTABLE REGION OF A MATERIAL

[75] Inventors: Eberhard Rommel, Ulm-Gögglingen; Rainer Kimmich, Ulm, both of Fed. Rep. of Germany

[73] Assignee: Kohler Schmid & Partner, Fed. Rep. of Germany

[21] Appl. No.: 64,738

[22] PCT Filed: Mar. 14, 1990

[86] PCT No.: PCT/DE90/00190

§ 371 Date: Sep. 13, 1991

§ 102(e) Date: Sep. 13, 1991

[87] PCT Pub. No.: WO90/10878

PCT Pub. Date: Sep. 20, 1990

Related U.S. Application Data

[63] Continuation of Ser. No. 762,024, Sep. 13, 1991, abandoned.

[30] Foreign Application Priority Data

Mar. 15, 1989 [DE] Fed. Rep. of Germany ....... 3908392

[51] Int. Cl.$^5$ ............................................. G01N 33/20
[52] U.S. Cl. ..................................... 324/309; 324/307
[58] Field of Search ............... 324/309, 307, 313, 312; 128/653.2

[56] References Cited

U.S. PATENT DOCUMENTS

| | | | |
|---|---|---|---|
| 4,345,207 | 8/1982 | Bertrand et al. | 324/314 |
| 4,743,850 | 5/1988 | Sepponen | 324/309 |
| 4,799,015 | 1/1989 | Sepponen | 324/312 |
| 4,820,983 | 4/1989 | Bendall et al. | 324/307 |
| 4,947,119 | 8/1990 | Ugurbil et al. | 324/307 |
| 5,001,427 | 3/1991 | Fujiwara | 324/307 |
| 5,099,206 | 3/1992 | Imaizumi et al. | 324/307 |
| 5,103,175 | 4/1992 | Kimmich et al. | 324/309 |

FOREIGN PATENT DOCUMENTS 0195404 9/1986 European Pat. Off. ..... G01N 24/08

OTHER PUBLICATIONS

Journal of Magnetic Resonance, 60, 337-341 (1984), Garroway et al.: NMR Imaging in Solids by Multiple-Quantum Resonance.
Journal of Mangetic Resonance, 78, 205-212 (1988), Knüttel et al.: Multiple-Volume-Selective Proton NMR Spectroscopy and Spectral Editing by Spin-Echo Double Resonance (VOSY + SEDOR).
Journal of Magnetic Resonance, 67, 148-155 (1986) Luyten et al.: Solvent-Suppressed Spatially Resolved Spectroscopy. An Approach to High-Resolution NMR on a Whole-Body MR System.
Journal of Magnetic Resonance, 83, 299-308 (1989) Rommel et al.: Slice Excitation and Localized NMR Spectroscopy on the Basis of Spin Locking.
NMR Imaging in Biomedicine, Academic Press, Inc. New York, London; P. Mansfield et al., 95-97 (1982).
NMR In Chemistry A Multinuclear Introduction, W. Kemp (1986) pp. 152-153.

Primary Examiner—Michael J. Tokar
Assistant Examiner—Raymond Y. Mah
Attorney, Agent, or Firm—Cesari and McKenna

[57] ABSTRACT

A certain preselectable region of a sample, for example, a disc or a volume component, is selectively excited in that the transverse magnetization of the desired region is phase-coupled by spin locking, while the spin coherences in the remaining spatial region are destroyed by phase relaxation. The thickness of the desired disc or the dimensions of the desired volume component can be varied by adjusting the amplitude of the spinlock pulse while the magnetic field gradients are kept constant. Comparatively low magnetic field gradients can be used. Even with such low magnetic field gradients, good spatial resolution can be achieved while reducing the energy of the radio-frequency excitation. Because of the relatively low energy irradiation of the material being investigated, the process is especially suitable for in vivo applications.

9 Claims, 6 Drawing Sheets

METHOD FOR PERFORMING MAGNETIC RESONANCE SPECTROSCOPY OR TOMOGRAPHY IN A PRESELECTABLE REGION OF A MATERIAL

This application is a continuation of 07/762,024, filed Sep. 13, 1991, now abandoned.

FIELD OF THE INVENTION

The invention relates to a process for magnetic resonance spectroscopy or tomography in a preselectable region of a material. The process is especially suitable for investigating biological tissue by nuclear spin resonance tomography. The invention is also considered to include measurement processes (e.g. relaxometry, diffusion measurements, flow measurements) derived from the said process.

BACKGROUND OF THE INVENTION

U.S. Pat. No. 4,743,850 (Sepponen) discloses a process for spatial determination of the relaxation time $T_{1p}$ in a rotating frame of reference. In this process, the sample is first irradiated with a $\pi/2$ pulse in order to generate a transverse magnetization, and then with a spin lock pulse at a 90° angle to the $\pi/2$ pulse, both of the pulses being applied in the absence of gradients. The pulse application is followed by volume selection by means of applied gradients, and lastly by signal evaluation. The problem with this process is that strong radio-frequency and gradient fields are needed for layer- or volume-selective excitation. These strong fields are undesirable for in vivo applications.

The object of the present invention is to make available processes in which strong radio-frequency and gradient fields are not needed for layer- or volume-selective excitation of a sample for in vivo investigations, and in which it is possible to acquire a reliable and versatile signal from the region of interest.

SUMMARY OF THE INVENTION

According to the present invention, this object is achieved once a transverse magnetization has been excited (or already exists) in the material, by irradiating the preselectable region of the material with a radio-frequency pulse (spin lock pulse) and simultaneously applying a weak magnetic field gradient, The combination of the spin lock pulse and the applied gradient spin locks the transverse magnetization in the region of interest, while in the remaining regions of the material, the applied gradient destroys the spin coherences. The coherence in the region of interest, which is ultimately measured as free induction decay, is protected against phase decay by means of the spin lock pulse, in a manner discussed specifically below. All other spins are dephased by the weak field gradients.

The invention is compatible with many processes for editing (e.g. suppressing undesired signals) and processing the spin coherences. One emphasis of the invention is in the area of resonance spectroscopy, in which, in contrast to tomography, the main interest is not in generating images but in obtaining data.

In one embodiment of the invention, prior to application of a split lock pulse (SL), the transverse magnetization of the material is generated by irradiation with a hard (i.e. broad-band) radio-frequency pulse or a composite pulse or by means of another excitation process, with the angle between magnetic field and magnetization vector being preferably 90°. This angle (flip angle) can also deviate from 90°.

In a further embodiment of the process according to the present invention, the spin lock spin coherences can be generated by various processes which are useful for other purposes. For example, homo- or hetero-, nuclear editing or line suppression methods can be used in preceding preparation and evolution intervals to generate the required coherences. Line suppression pulses can also be applied between or after the layer selection actions. Moreover, additional homo-, or hetero-, nuclear echo pulse sequences can be added (for example for editing or polarization transfer purposes) after a region has been selected.

In another embodiment of the process according to the present invention, a thin disc, whose thickness can be adjusted by varying the amplitude of the spin lock pulse and/or the strength of the field gradient, is selected as the region of interest of the material sample. It is especially advantageous to predefine the field gradient and keep it constant during the process, and to define the thickness of the disc simply by adjusting the amplitude of the spin lock pulse. After the spin lock pulse, a hard radio-frequency pulse or a composite pulse or another spin excitation process can be applied, so that the selected layer magnetization is transferred in the direction of the magnetic field or in another direction.

In a further embodiment, two layer selections are performed sequentially by means of gradients in two different spatial directions, so that the magnetization of a rod-shaped region is transferred in the direction of the magnetic field or in another direction. A well-defined volume component can be selected by sequentially performing three layer selections by means of gradients in three different spatial directions, so that the magnetization of a parallelepiped-shaped volume region is transferred in the direction of the magnetic field or in another direction. In this context, the magnetization of the selected region can be converted into the transverse direction by a radio-frequency pulse or another split excitation process, and read out by means of a free induction decay.

In still a further embodiment, after the end of the spin lock pulse, the field gradient is configured in a self-refocusing manner, resulting in spin coherences of the selected region that can be read out directly or evolve further (SLISE).

In yet a further embodiment of the process according to the present invention, the spin coherences generated in a layer or a rod-shaped region are transferred—after intervals or after pulse sequences having spectrum editing or polarization transfer effects have been applied—by a radio-frequency pulse in the direction of the magnetic field or in another direction, and then converted by means of a further layer-selective operation into spin coherences of a rod or parallelepiped-shaped region. Additional homo-, or hetero-, nuclear echo pulse sequences, for example for editing or polarization transfer purposes, can also be added after region selection.

In a further embodiment of the process according to tile present invention, a spin decoupling is performed before, between, or after the layer selection actions. So-called "dynamic" polarization can also be applied before, between, or after the layer selection actions.

It can be advantageous, in the process according to the present invention, to determine the spin lattice relaxation times in the rotating frame of reference in a region selective manner by varying one or more spin lock intervals. In one embodiment of the process according to the present invention, region selection is associated with the determination of the spin lattice relaxation time or the transverse relaxation time or the dipole relaxation time or quadruple relaxation time or the diffusion coefficient, or with another parameter suitable for characterizing the material.

The present process has the particular advantage that complex pulse shapes are not necessary for the spill lock pulse, and that the pulse amplitude, especially for in vivo applications, is low enough to rule out any hazardous level of radio-frequency radiation. Although the process is designed for nuclear spin resonance investigation and imaging of biological tissue, it can also be utilized in conventional magnetic resonance spectroscopy, for example in electron spin resonance spectrometers or tomographs, on organic and inorganic samples.

It is also possible to use the inventive method with preceding pulse sequences that act to suppress or filter ("edit") certain lines. Examples of such pulse sequences are Multiquantum filtering, CYCLPOT, saturation pulses, etc. In addition, line suppression pulses can be used to selectively excite the frequency of the line being suppressed. Any spectrally resolved line can be suppressed.

Further advantages, properties, and possible applications of the invention are indicated in the following description in conjunction with the drawing.

DETAILED DESCRIPTION OF THE PREFERRED EMBODIMENTS

In the following description, in accordance with conventional practice, the direction of the constant magnetic field, $B_0$, is designated as the Z axis. Other expressions used hereinafter are as follows. The expression "transverse magnetization" used here is defined as the magnetization component at right angles to the direction of the constant magnetic field, $B_0$. The transverse magnetization is generated by a radio-frequency pulse or by an incomplete fast adiabatic resonance pass, or it is already present as a result of a previous sequence (e.g. editing, relaxation time measurement, diffusion coefficient measurement, etc.).

The term "composite pulse" denotes a composite radio-frequency pulse that generates certain flip angles and is only weakly influenced by misadjustments. The expression "interval having a spectrum editing effect" denotes, for example, an interval in which multi-quantum coherences are generated for multrquantum filtering. The expression "interval having a polarization transfer effect" means, for example, an interval such as occurs in the known polarization transfer processes (INEPT, DEPT, CYCLPOT, etc.). Such intervals are typical components of concrete pulse sequences.

The expression "region selection" is used as a general ten-n for layer, rod, or volume selection (parallelepiped selection).

Figure 1A:
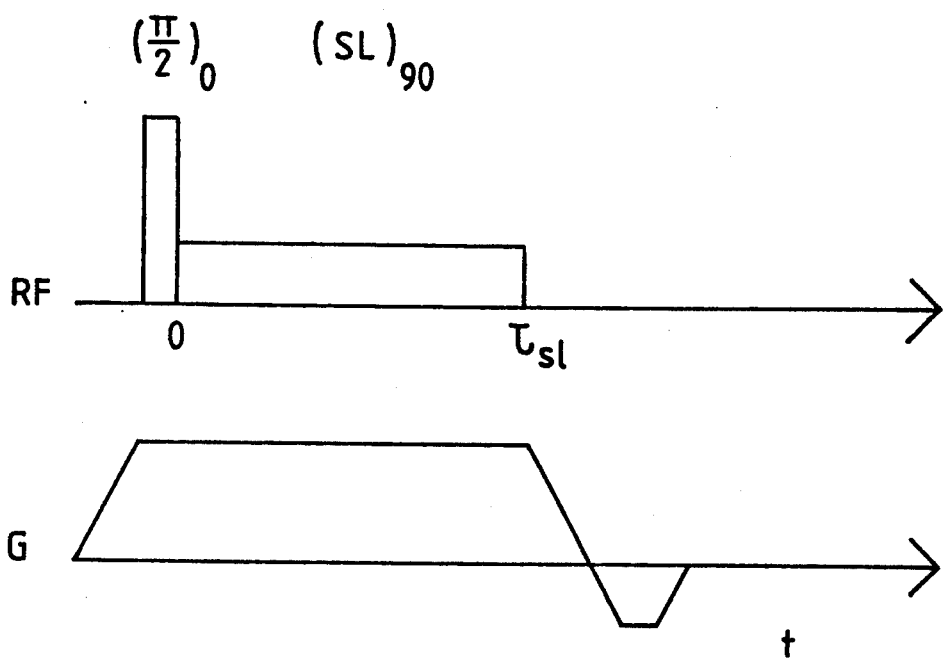
FIG. 1a shows a first embodiment of a pulse pattern of a spin lock pulse according to the present invention for layer-selective excitation of spin coherences.

A preferred form of the radio-frequency portion of the pulse pa em is depicted in FIG. 1a, comprising a hard (i.e. broad-band and therefore non-selective) $\pi/2$ radio-frequency pulse with direction 0° (the X axis in this example), followed by a spin lock pulse (SL) with a phase angle rotation of 90° (i.e., the Y axis in this example). The word "hard" is used in a known manner to describe a broad-band pulse. The magnetic field gradient (G) (in the X axis in this example) is applied simultaneously with the $\pi/2$ pulse and the spin lock pulse. This gradient causes a change in the constant magnetic field $B_0$ in the direction of the X axis, which extends at right angles to the vector of the magnetic field $B_0$. In this practical example, the amplitude, $B_1$, of the spin lock pulse and the absolute value, G, of the field gradient determine the thickness, $\Delta x$, of a selected disc, while the position and orientation of the disc are defined by the carrier frequency of the spectrometer and the direction of the field gradient:

$$\Delta x \sim B_1/G$$

The amplitude $B_1$ of the (relatively long) spin lock pulse is considerably less than that of the (relatively short) $\pi/2$ pulse, so that high doses of radio-frequency radiation can be avoided when human beings are being investigated.

During the spin lock pulse, the phase-coupled spins relax in accordance with their longitudinal relaxation time $T_{1p}$ in the rotating frame of reference. All other spins lose their fixed phase reference after a time constant $T_{2*}$ that is characteristic of the instantaneous $B_0$ field distribution. In the presence of a sufficiently strong $B_0$ gradient (i.e. a magnetic gradient oriented in any direction, which changes the strength of the magnetic field $B_0$ in its direction), this time constant is short compared to the longitudinal relaxation time in the rotating frame of reference. When the duration of the spin lock interval $t_{sl}$ satisfies the condition:

$$T_{2*} << t_{sl} << T_{1p}$$

the only coherence that remains and appears as free induction decay is that of the spins from the desired region. In this embodiment of the invention, the field gradient G shown in FIG. 1a is applied in a special direction, for example, in the X axis direction. As a result, a disc profile is then scanned. The disc thickness is proportional to the amplitude of the spin lock pulse and inversely proportional to the field gradient. The thickness of the disc can therefore be adjusted either by varying both parameters simultaneously, or by keeping one parameter constant while varying the other. Preferably, the gradient is kept constant and the amplitude of the spin lock pulse is varied. The shape of the spin lock pulse does not need to be changed, and the thickness of the disc is independent, within certain limits, of the length of the spin lock pulse, in contrast to the usual narrow-band pulse methods. As will be explained later, satisfactory results call be achieved with a spin lock pulse duration of between 3 and 20 ms, while a range between 5 and 10 ms is preferred.

The transverse magnetization that is phase-coupled by spin locking has a relaxation time $T_{1p}$ during the spin lock interval $t_{sl}$. The coherence and spin state change echo that is recorded after application of the complete pulse sequence is therefore weighted with the proportionality factor $$c_2 \sim \exp(-t_{sl}/T_{1p})$$

This makes it possible to determine $T_{1p}$ or to measure spectra with partial $T_{1p}$ relaxation. In a further embodiment, the pulse for disc selection can be expanded to three dimensions, as discussed below.

Figure 1B:
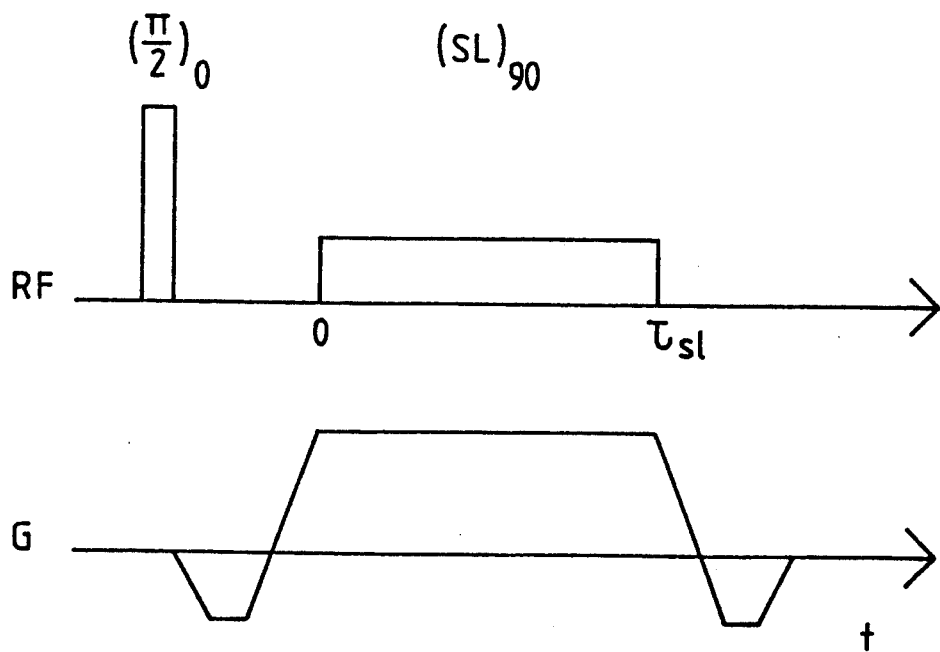
FIG. 1b shows another embodiment of a pulse pattern of a spin lock pulse according to the present invention for layer-selective excitation of spin coherences.

FIG. 1b shows a further embodiment of the invention, in which the pulse sequence begins with a hard $\pi/2$ pulse in the absence of a gradient. The gradient, which begins after the end of the $\pi/2$ pulse, exhibits a change in direction, resulting in a gradient echo that reaches its maximum precisely when the field gradient plateau begins. At this point in time, the spin lock pulse is initiated. The position of the disc being investigated is defined by the offset of the transmission frequency. The optimum frequency changeover point lies precisely at the maximum of the echo, since at that point no problems with phase adjustment will occur. Otherwise, the phase difference between the radio-frequency excitation and the spin precession would need to be taken into account. After the spin lock pulse, the gradient is deactivated (with another change in direction) in such a way that a further gradient echo appears. The advantage of this embodiment is that the transverse magnetization is generated in the absence of the field gradient. This means that the bandwidth or excitation bandwidth of the $\pi/2$ pulse can be made smaller than in the preceding example according to FIG. 1a. The position and width of the selectable or selected region are determined in the same way as in the preceding example according to FIG. 1a.

Experiments have been performed to demonstrate the effectiveness and reliability of the embodiment that is based on the preferred pulse train according to FIG. 1a. A Bruker BMT 47/40 in vivo nuclear spin resonance spectrometer, operating with a proton resonance frequency of 200 MHz, was used for this purpose. A gradient tube 30 cm in diameter was mounted, at room temperature, in the horizontal room-temperature bore of the magnet, with an inside diameter of 40 cm. The sample container consisted of a conventional birdcage resonator. The experimental object used for layer excitation was a cube, dimensions 4×4×4 cm, filled with water.

The amplitudes ($B_1$) of the spin lock pulse were calibrated using the length of a $\pi/2$ test pulse. The duration of the hard $\pi/2$ pulse was 90 μs. The spin lock period was varied, with satisfactory results obtained for $t_{sl}$ values in the range between 3 and 20 ms, with a preferred range from 5 to 10 ms. For the experimental sample with a field gradient of 1.4 KHz/cm (corresponding to 0.33 Gauss/cm), the phase relaxation time $T_2*$ was considerably less than the duration $t_{sl}$ of the spin lock pulse.

Figure 2:
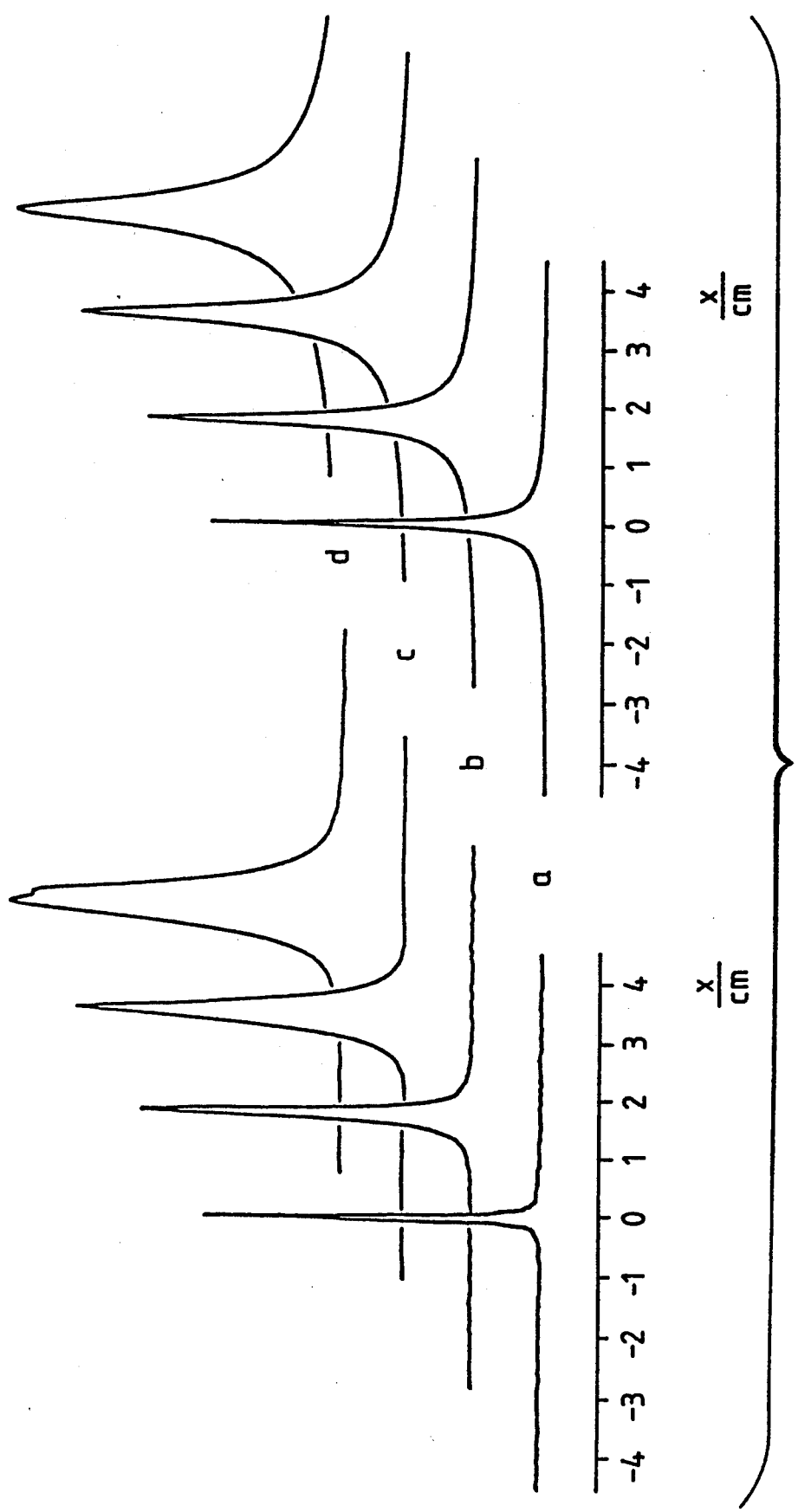
FIG. 2a shows measured and calculated profiles that were obtained by Fourier transforming the Hahn echo produced in accordance with one embodiment of the invention.

FIG. 2a shows the profiles obtained by Fourier transformation of a Hahn echo (split echo) of the free induction decay. The profiles were recorded with a relatively weak $B_0$ gradient of 0.33 G/cm. For comparison, the profiles were calculated using the formula:

$$M_{sl}(\chi) = M_0 \cdot \cos^2[\arctan(x \cdot G_\chi / B_1)]$$

where $M_{sl}$ represents the phase-coupled magnetization, $M_0$ the magnetization at the beginning of the spin lock pulse, and x the coordinates with the origin defined by the resonance condition. The resulting calculated profiles are depicted in FIG. 2b. The agreement between observation and calculation demonstrates the usefulness and reliability of the method based on the spin lock and phase relaxation effects described earlier.

Figure 3:
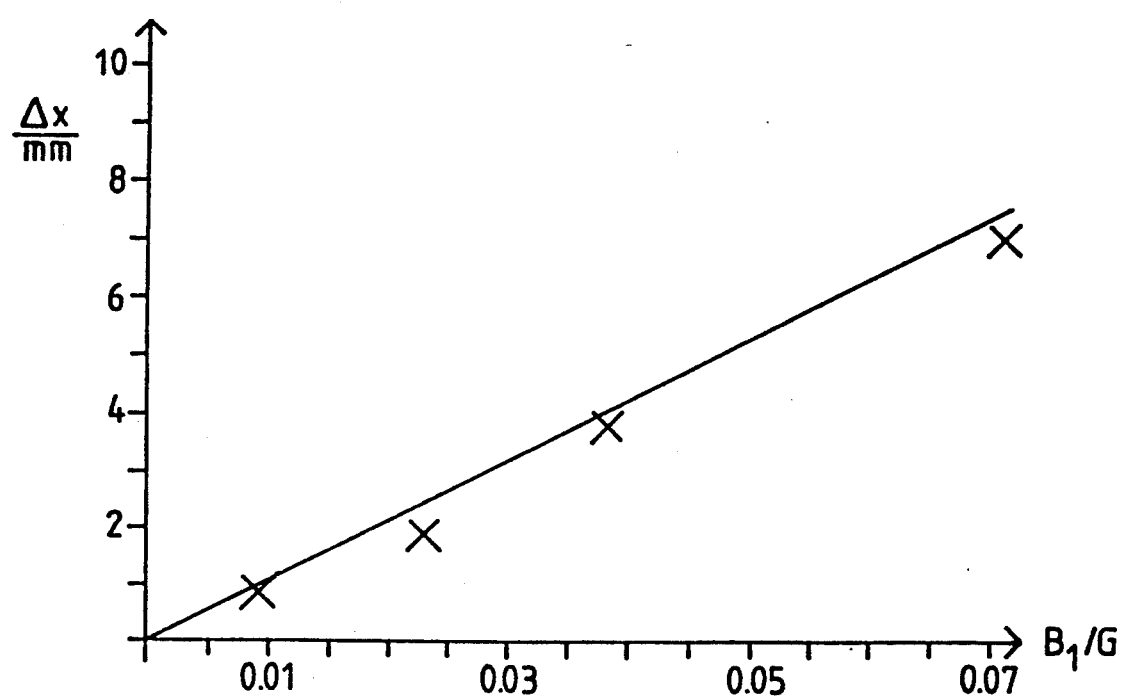
FIG. 3 shows the spin lock amplitude as a function of disc thickness, according to one embodiment of the invention.

FIG. 3 shows the results of experiments in which the amplitude $B_1$ of the spin lock pulse according to FIG. 1a was vaned. It is evident that the layer thickness is a linear function of the amplitude. This linear relationship has the advantage of allowing easy adjustment of the desired thickness with no need for stronger field gradients or complex pulse shapes.

Figure 4:
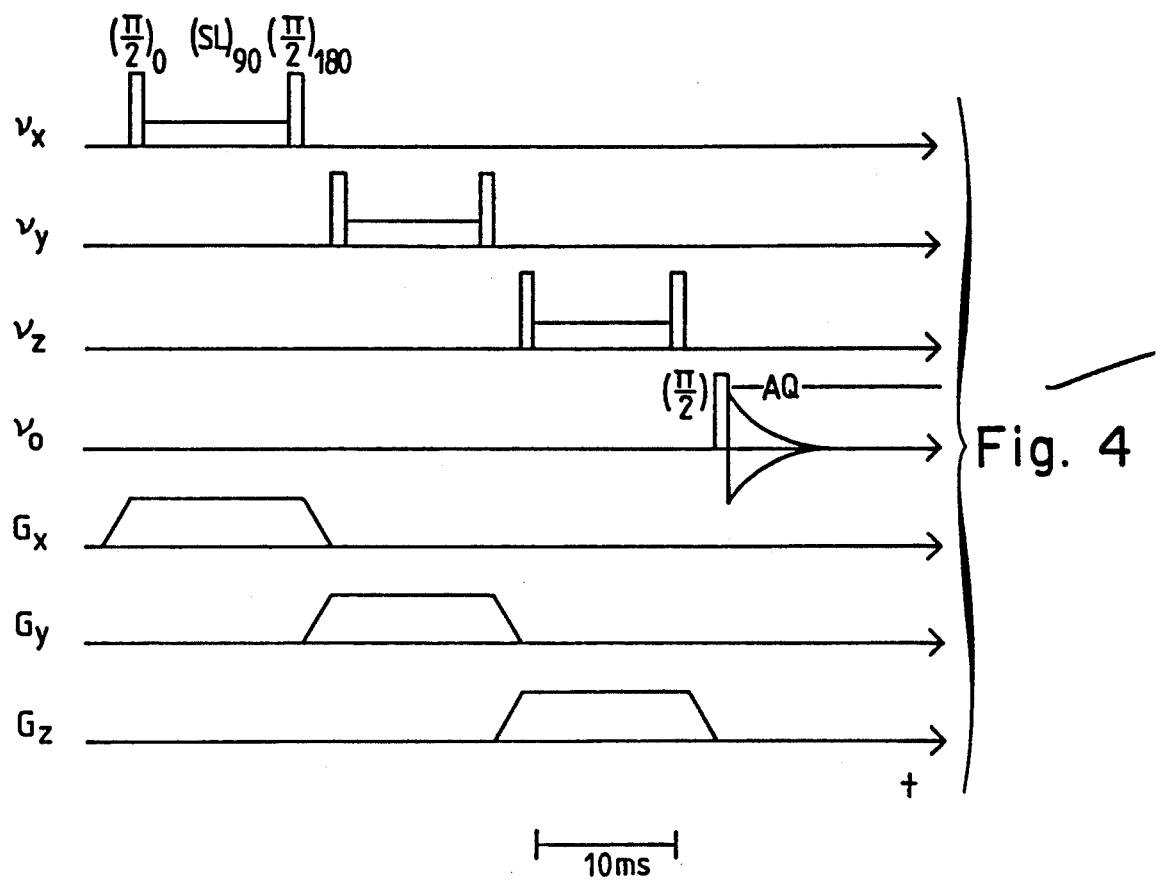
FIG. 4 indicates the pulse pattern for three-dimensional spin locking, according to a further embodiment of the invention.

In a further embodiment of the invention, the process can be expanded to three dimensions, so that the material region of interest can be selected as a volume component. The spin lock pulse is preferably applied during time periods in which the magnetic field gradients are constant. A preferred pulse pattern is depicted in FIG. 4. The three separate radio-frequency pulse groups (illustrated as the first three lines in FIG. 4) are applied in succession, with a field gradient ($G_x$, $G_y$, $G_z$) being applied during each radio-frequency pulse group in one of the three special coordinate directions x, y and z. Each pulse group consists of a hard $\pi/2$ pulse, a spin lock pulse (SL), and a concluding hard $\pi/2$ pulse with the same or opposite phase. The latter restores the phase-coupled coherence in the Z axis. This has the advantage that the precession and radiation phases and frequencies must coincide only during the time spans in which the Larmor and transmission frequencies are kept constant. The Z magnetization that remains after application of the three selective spin lock sequences is ultimately (as illustrated in line 4 of FIG. 4) brought into the transverse plane by a $\pi/2$ read pulse. Signal acquisition (AQ) occurs in the absence of any gradient.

With this embodiment, it is important that the gradients be kept constant during the spin lock pulses. Without this feature, adiabatic magnetization transfer to or from directions that lie outside the resonance of the effective field would interfere with full utilization of the dephasing effect. As in the previous embodiment for discs, the volume component can easily be adjusted by setting the amplitudes of the three spin lock pulses appropriately. The pulse group according to FIG. 4 is preferred for volume selection. A modification on the basis of the pulse in FIG. 1b can also be used.

The quality of the measurements with volume selection was tested in experiments in which the samples shown in FIG. 5 were used. Several plastic balls were filled with various substances that were selected on the basis of their known individual line spectra. Measurement of these resonance lines is therefore also an indication of the localization of the signal acquisition.

Figure 6A:
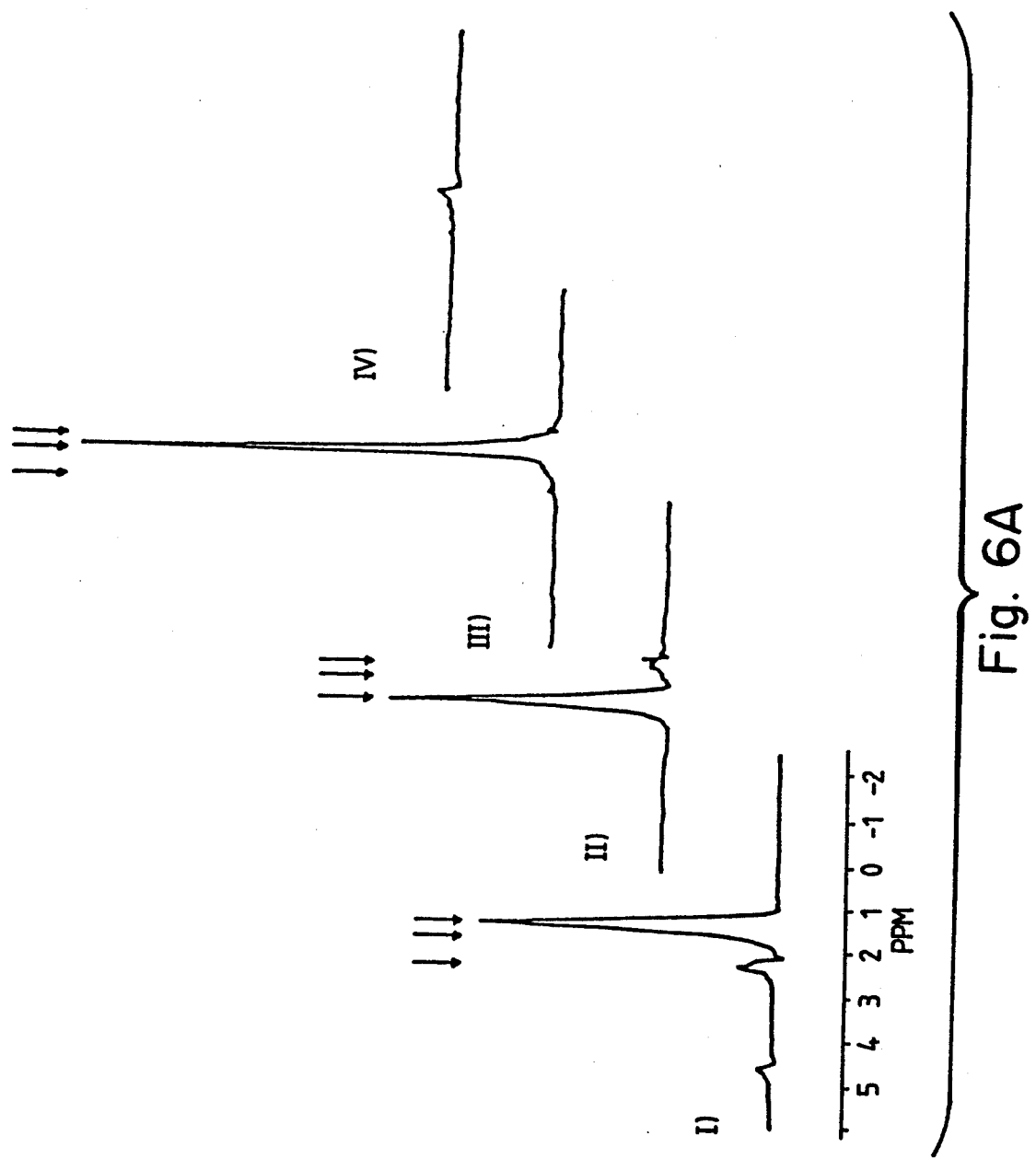
FIGS. 6a and 6b indicate spectral curves recorded from the samples according to FIG. 5.
Figure 6B:
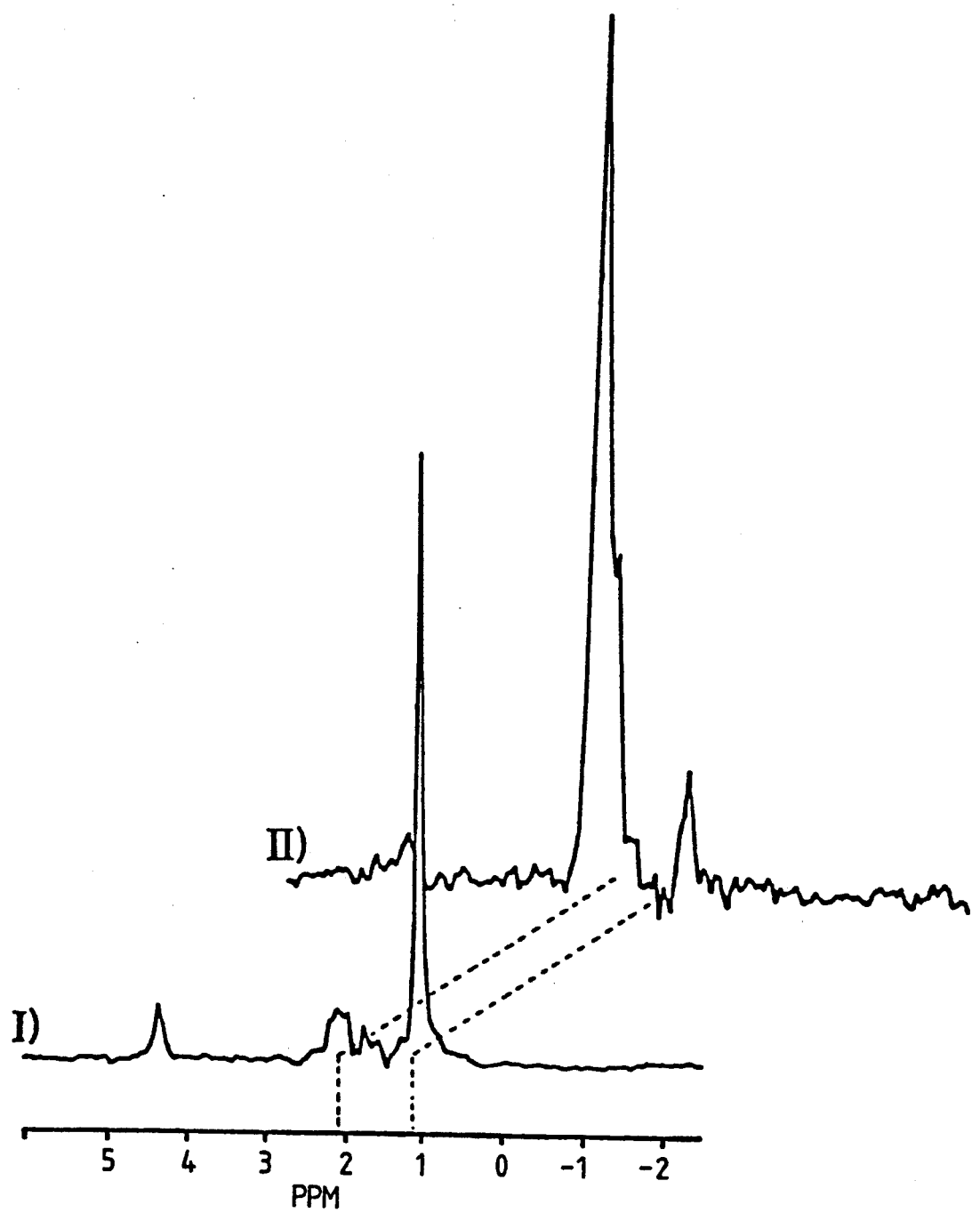

FIGS. 6a and 6b show the proton spectra that were obtained with a Bruker BMT 47/40 tomograph using the preferred pulse sequence according to FIG. 4. In each case, the curves were recorded with a single scan.

Figure 5A:
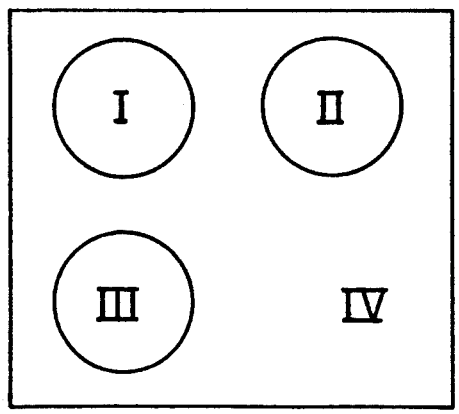
FIGS. 5a–b show two examples of samples that are used in experimental series to test the volume-selective process according to one embodiment of the invention.
Figure 5B:
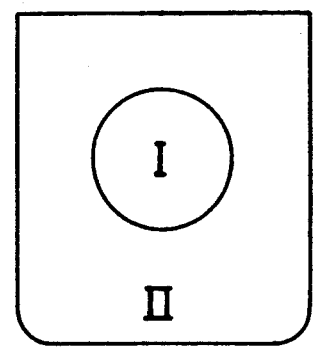

Curves I, II, III and IV in FIG. 6a were recorded in the volume components that are located in the correspondingly labeled sample regions in FIG. 5a. Similarly, curves I and II in FIG. 6b were recorded from the corresponding region of the sample shown in FIG. 5b. The dimensions selected for the excited volume components were 7×7×7 mm³. Chemical line shifts in the substances were taken into account. A spin lock pulse lasting 10 ms was sufficient to avoid the effects of coherent movements of non-phase-coupled spins. Results were still satisfactory even at 5 ms. The dephasing time constant $T_{2^*}$ was considerably aborter than the pulse duration. The spectrum obtained corresponds precisely to the position that should be occupied by the selected volume component.

It is evident from the presentation above that the present invention can be put into practice relatively easily, and is well suited especially for nuclear spin resonance tomography. No complex pulse shapes need to be produced, and the area of interest in the object being investigated can easily be adjusted by controlling the radio-frequency amplitude of the spin lock pulse. It is possible to select very thin discs (less than 1 mm thick) without applying strong field gradients. In this instance (a disc 1 mm thick), a spin lock pulse amplitude of approximately 0.015 G (full width at half-maximum) would be necessary at a field gradient of 0.33 G/cm. For signal acquisition from thicker regions, it would be preferable to reduce the field gradients rather than increasing the amplitudes of the spin lock pulses.

A further advantage of the invention is the possibility of obtaining information about the spin lattice relaxation time in the rotating frame of reference. A direct determination of this value yields an additional parameter which is characteristic of the tissue being investigated, or, for example, of certain organs or parts of organs. It may also be of interest to obtain $T_{1\rho}$-weighted images when assessing the condition of materials, especially biological materials.

The process according to the present invention can be utilized in magnetic resonance tomography. A certain preselectable region of a sample, for example, a disc or a volume component, is selectively excited in that the transverse magnetization of the desired region is phase coupled by spin locking, while the spin coherences in the remaining spatial region are destroyed by please relaxation. The thickness of the desired disc or the dimensions of the desired volume component can be varied by adjusting the amplitude of the spin lock pulse while the magnetic field gradients are kept constant. Comparatively low magnetic field gradients can be used. Even with such low magnetic field gradients, good spatial resolution can be achieved while reducing the energy of the radio-frequency excitation. Because of the relatively low energy radiation of the material being investigated, the process is especially suitable for in vivo applications.

In circumstances where multiplet splitting or the evolution of the coherences which leads thereto must be avoided, spin decoupling is of interest and can be used with the processes of the present invention. Spin decoupling is performed by selectively irradiating the coupled spin group with an intensive radio-frequency. The time duration during which the irradiation is applied is not arbitrary, but rather refers either to an evolution interval or a detection interval. In dynamic polarization, the application time precedes signal detection.

Other known measurement processes can be associated, by means of parameters that are associated with the magnetic resonance, with the volume selection process according to the present invention in such a way that measurement occurs in a volume-selective manner. For example, the inventive process can follow an excitation pulse ($\pi/2$ pulse) or an inversion pulse ($\pi$ pulse) after a variable interval. The detected signal is then dependent on the spin lattice relaxation time.

Two layer selections can be performed according to the process of the present invention can be combined with a subsequent layer-selective excitation by means of a SINC pulse in the presence of a field gradient.

What is claimed is:

1. A method of performing magnetic resonance spectroscopy or tomography in a preselected sample region having a net nuclear magnetization direction and being positioned in a homogeneous external magnetic field having a field direction, said method comprising the steps of:

A. applying a first RF pulse to at least the preselected region, the RF pulse having a direction and magnitude selected to create a first nuclear magnetization component in a direction transverse to the field direction;

B. applying, to refocus the first nuclear magnetization at a time t, a first constant magnetic field gradient having a direction to at least the preselected region for a predetermined time interval following the application of the RF pulse in step A;

C. applying, beginning at time t, a second RF pulse during the predetermined time interval in step B wherein said second rf pulse is a spin lock pulse;

D. applying a third RF pulse to at least the preselected region, the third RF pulse having a direction and magnitude selected to transfer the first nuclear magnetization component into the field direction;

E. removing the first constant magnetic field gradient;

F. applying a fourth RF pulse to at least the preselected region, the fourth RF pulse having a direction and magnitude selected to create a second nuclear magnetization component in a direction transverse to the field direction; and G. detecting an induction signal produced by the second nuclear magnetization component.

2. A method of performing magnetic resonance spectroscopy or tomography in a preselected sample region having a net nuclear magnetization direction and being positioned in a homogeneous external magnetic field having a field direction, said method comprising the steps of:

A. applying a first constant magnetic field gradient having a direction to at least the preselected region for a predetermined time interval;

B. during the predetermined time interval in step A, applying a first RF pulse to at least the preselected region, the RF pulse having a direction and magnitude selected to create a first nuclear magnetization component in a direction transverse to the field direction;

C. applying a second RF pulse during the predetermined time interval in step A wherein said second rf pulse is a spin lock pulse;

D. applying a third RF pulse to at least the preselected region, the third RF pulse having a direction and magnitude selected to transfer the first nuclear magnetization component into the field direction;

E. removing the first constant magnetic field gradient;

F. applying a fourth RF pulse to at least the preselected region, the fourth RF pulse having a direction and magnitude selected to create a second nuclear magnetization component in a direction transverse to the field direction; and G. detecting an induction signal produced by the second nuclear magnetization component.

3. A method of performing magnetic resonance spectroscopy or tomography in a preselected sample region having a net nuclear magnetization direction and being positioned in a homogeneous external magnetic field having a field direction, said method comprising the steps of:

A. applying a first RF pulse to at least the preselected region, the RF pulse having a direction and magnitude selected to create a first nuclear magnetization component in a direction transverse to the field direction;

B. applying, to refocus the first nuclear magnetization at a time t, a first constant magnetic field gradient having a direction to at least the preselected region for a predetermined time interval following the application of the RF pulse in step A;

C. applying a second RF pulse during the predetermined time interval in step B wherein said second rf pulse is a spin lock pulse;

D. removing the first constant magnetic field gradient;

E. applying a refocusing gradient to produce a gradient echo; and

F. detecting an induction signal produced by the gradient echo.

4. A method of performing magnetic resonance spectroscopy or tomography in a preselected sample region having a net nuclear magnetization direction and being positioned in a homogeneous external magnetic field having a field direction, said method comprising the steps of:

A. applying a first constant field gradient having a direction to at least the preselected region for a predetermined time interval;

B. during the predetermined time interval in step A, applying a first RF pulse to at least the preselected region, the RF pulse having a direction and magnitude selected to create a first nuclear magnetization component in a direction transverse to the field direction;

C. applying a second RF pulse during the predetermined time interval in step A wherein said second rf pulse is a spin lock pulse;

D. removing the first constant magnetic field gradient;

E. applying a refocusing gradient to produce a gradient echo; and

F. detecting an induction signal produced by the gradient echo.

5. A method according to any one of claims 1-2 wherein after step E and before step F, the following steps are included:

E1. repeating steps A through E using a second constant magnetic field gradient in place of the first constant magnetic field gradient, the second magnetic field gradient having a direction different from the first constant magnetic field gradient direction.

6. A method according to any one of claims 1-2 wherein after step E and before step F, the following steps are included:

E2. repeating steps A through E using a second constant magnetic field gradient in place of the first constant magnetic field gradient, the second magnetic field gradient having a direction different from the first constant magnetic field gradient direction; and E3. repeating steps A through E using a third constant magnetic field gradient in place of the first constant magnetic field gradient, the third magnetic field gradient having a direction different from the first constant magnetic field gradient direction and the second constant magnetic field gradient direction.

7. A method according to claim 6 wherein the first magnetic field gradient direction, the second magnetic field gradient direction and the third magnetic field gradient direction are mutually perpendicular to each other.

8. A method according to any one of claims 1-2 wherein the first RF pulse is broad-banded.

9. A method according to claim 8 wherein the first, third and fourth RF pulses are 90° pulses.

* * * * *